(12) United States Patent
Patwardhan et al.

(10) Patent No.: US 7,375,431 B1
(45) Date of Patent: May 20, 2008

(54) SOLDER BUMP FORMATION IN ELECTRONICS PACKAGING

(75) Inventors: Viraj Patwardhan, Sunnyvale, CA (US); Nikhil V. Kelkar, San Jose, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 190 days.

(21) Appl. No.: 11/084,447

(22) Filed: Mar. 18, 2005

(51) Int. Cl.
 *H01L 23/48* (2006.01)
(52) U.S. Cl. ............ 257/773; 257/738; 257/779; 257/E23.021
(58) Field of Classification Search .......... 257/737, 257/738, 773, 779; 438/613
 See application file for complete search history.

(56) References Cited

U.S. PATENT DOCUMENTS

| | | |
|---|---|---|
| 5,400,950 A | 3/1995 | Myers et al. |
| 6,595,404 B2 * | 7/2003 | Suzuki et al. ............ 228/175 |
| 6,756,184 B2 | 6/2004 | Peng et al. |
| 6,759,319 B2 | 7/2004 | Viswanadam et al. |
| 6,809,020 B2 * | 10/2004 | Sakurai et al. ............ 438/613 |
| 7,034,402 B1 * | 4/2006 | Seshan ............ 257/781 |
| 7,141,869 B2 * | 11/2006 | Kim et al. ............ 257/673 |
| 2005/0116340 A1 * | 6/2005 | Shindo ............ 257/737 |

OTHER PUBLICATIONS

FlipChip International LLC, "Bumping Design Guide," Jul. 2004, pp. 1-40.

* cited by examiner

*Primary Examiner*—Zandra V. Smith
*Assistant Examiner*—Christy L Novacek
(74) *Attorney, Agent, or Firm*—Beyer Law Group LLP

(57) ABSTRACT

A polymer stencil is applied to the active surface of a wafer. The stencil has openings that at least partially overlay associated metallization pads on the wafer and divider strips positioned between adjacent openings. The divider strips are arranged to overlay portions of associated metallization pads so that at least two adjacent openings overlay portions of each metallization pad. After the stencil has been positioned, a solder paste is applied to the stencil openings. The solder paste may then be reflowed with the polymer stencil remaining in place. The solder naturally creeps under the stencil so that unitary solder bumps are formed on each metallization pad. The described methods and arrangements can be used to create low profile solder bumps that are not attainable using conventional solder bump formation techniques.

13 Claims, 6 Drawing Sheets

SOLDER BUMP FORMATION IN ELECTRONICS PACKAGING

BACKGROUND OF THE INVENTION

The present invention relates generally to the packaging of integrated circuits. More particularly, the invention relates to the formation of solder bumps for use in integrated circuit packaging.

There are a number of conventional processes for packaging integrated circuits. In many situations it is desirable to form solder bumps directly on an integrated circuit die. Typically, the solder bumps are formed on the wafer before the individual dice are cut (singulated) from the wafer. When the resulting die are mounted on a substrate or other appropriate carrier, the solder bumps may be reflowed to create electrical connections to the die. This style of electrically connecting integrated circuits is often called "flip chip" mounting. As integrated circuit devices and packaging get smaller and smaller, there are more situations where a flip chip type mounting is desirable.

In flip chip applications, there are a number of different solder bump sizes and spacings that are in commercial production. For example, one relatively standard solder bumps pitch is 500 microns. That is, the center-to-center distance between adjacent solder bumps is approximately 500 microns. Such a product may have metallization pads diameters on the order of 220-350 microns, maximum bump diameters on the order of 170-350 microns and bump heights on the order of around 200-280 microns. The next smaller relatively standard bump size contemplates the use of metallization pad diameters on the order of 150 microns, maximum bump diameters of about 170 microns and bump heights in the range of 125-130 microns. Of course, there are efforts to develop even smaller and lower profile devices.

In applications where it is desirable to minimize the total thickness of a packaged device, the height (thickness) of the solder bumps may become a limiting factor. By way of example, in some applications the die itself may be thinned to a thickness of 125 microns (or less). In such applications, even the smaller 125-130 micron bump height can take up over 50% of the total package thickness.

One problem that can be encountered when the size of the solder bumps is reduced too much is that the relative strength of the resulting joints may be too small for a particular application. For example, the described 125-130 micron high bumps on a 150 micron metallization pad may have a strength of only about 76 grams per joint. Although the existing solder bump formation techniques work well in many applications, there are continuing efforts to make thinner and stronger connections.

SUMMARY OF THE INVENTION

To achieve the foregoing and other objects of the invention a wafer level method and arrangement for creating low profile solder bumps on semiconductor dice is described. In a method aspect of the invention, a polymer stencil is applied to the active surface of a wafer. The stencil has openings that at least partially overlay associated metallization pads on the wafer and divider strips positioned between at least some adjacent openings. The divider strips are arranged to overlay portions of associated metallization pads such that at least two adjacent openings overlay portions of the each metallization pad having an associated divider strip. After the stencil has been positioned, a solder paste is applied to the stencil openings. The solder paste is then reflowed with the polymer stencil remaining in place. The reflowed solder forms solder bumps on the metallization pads. With this arrangement, solder creeps under the divider strips during the formation of the solder bumps, causing the divider strips to lift away from the metallization pads. Thus, a single unified solder bump is formed on each metallization pad that had solder paste applied thereto. In some embodiments, a subsequent reflow may be helpful to ensure uniform and consistent solder bump shapes.

Novel polymer stencil designs for use in solder bump formation are also described. As discussed above, the stencils include divider strips arranged to be positioned over associated metallization pads. Any suitable number of openings may be formed over the metallization pads. For example, in various implementations, two, four or more openings may overlay any particular metallization pad.

In various embodiments, the openings are arranged to extend over a portion of a passivation layer adjacent their associated metallization pad. In this manner the volume of solder used for each bond pad may be controlled by controlling the volumes of the associated openings.

The described methods and arrangements can be used to create low profile solder bumps that are particularly strong for a given bump height. They may also be used to obtain solder bump profiles that are not currently attainable using conventional solder bump formation techniques. For example, integrated circuit devices with small solder bumps having an aspect ratio (defined as the ratio of the solder bump height to the solder bump maximum diameter) that is less than approximately 0.6, 0.47 or even 0.35 are readily attainable. By way of example, in various implementations, solder bump heights of less than approximately 150 microns are readily attainable on metallization pads having a footprint diameter that is greater than approximately 250 microns. In a particular implementation, solder bump heights of no more than approximately 130 microns are readily attainable on metallization pads having a footprint diameter of at least approximately 280 microns. In certain applications, the use of oversized metallization pads can be useful in helping to reduce light induced interference to the underlying semiconductor devices.

Although the invention is described primarily in the context of forming solder bumps on semiconductor dice, the techniques are equally applicable to forming solder bumps on other substrates.

BRIEF DESCRIPTION OF THE DRAWINGS

The invention, together with further objects and advantages thereof, may best be understood by reference to the following description taken in conjunction with the accompanying drawings in which.

It is to be understood that, in the drawings, like reference numerals designate like structural elements. Also, it is understood that the depictions in the figures are diagrammatic and not to scale.

DETAILED DESCRIPTION OF THE PREFERRED EMBODIMENTS

Figure 1A:
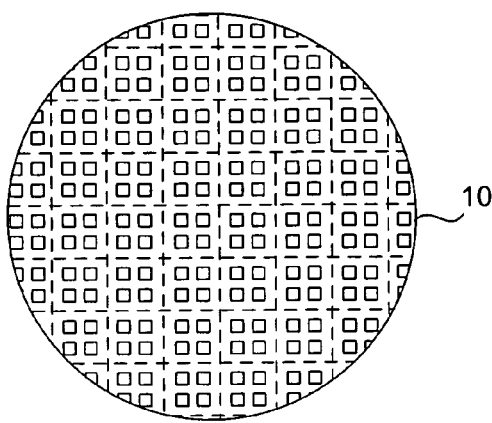
FIG. 1(a) is a diagrammatic top view of a wafer having a prior art polymer solder stencil positioned thereon.
Figure 1B:
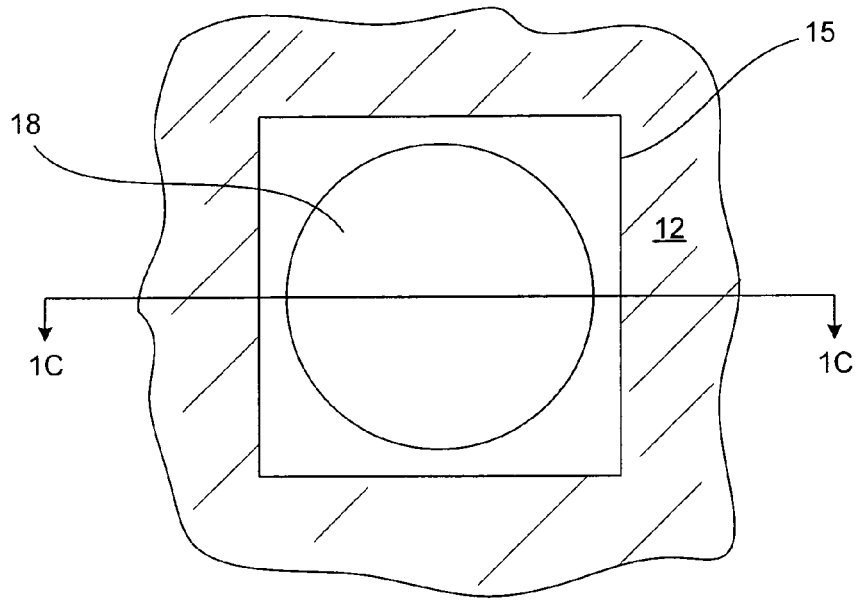
FIG. 1(b) is a diagrammatic top view of the polymer stencil shown in FIG. 1(a) showing a stencil opening formed over a single metallization pad.
Figure 1C:
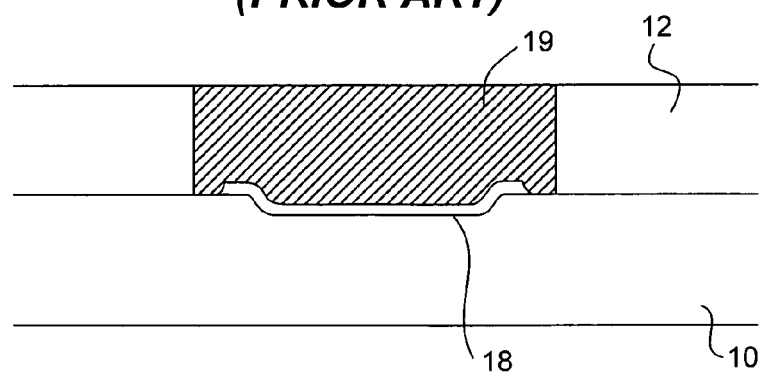
FIG. 1(c) is a diagrammatic side view of the polymer stencil shown in FIG. 1(b) over a single metallization pad with the solder paste in place.
Figure 1D:
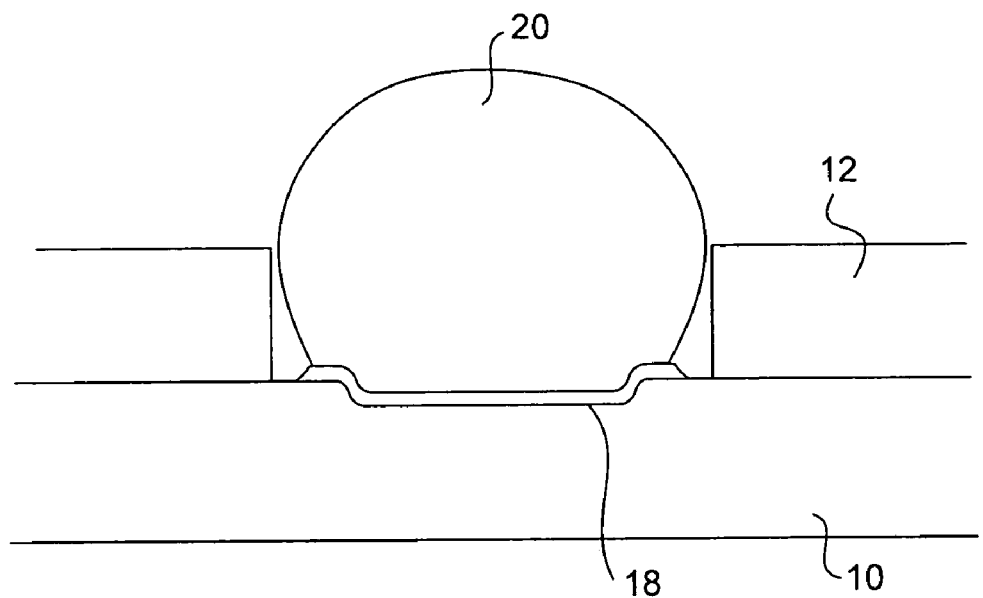
FIG. 1(d) is a diagrammatic side view of the arrangement shown in FIG. 1(c) after the solder has been reflowed.

Flip Chip International of Phoenix, Ariz. (www.flipchip.com) developed a stencil printing based wafer bumping process that utilizes a stencil formed from laminate polymeric films. As seen in FIG. 1(a)-1(d), the polymeric mask 12 is applied to a wafer 10. The mask 12 has openings 15 located over the metallization pads 18 on wafer 10 as best seen in FIG. 1(b). After the mask 12 is positioned, solder paste 19 is stencil printed into the openings 15 as best seen in FIG. 1(c). The solder is then reflowed to form solder bumps 20 as best seen in FIG. 1(d). After the solder bumps 20 have been reflown, the mask 12 may be removed since it is formed from a material that does not wet or adhere to solder. Alternatively, if desired, the mask 12 may be left in place. Although the polymeric mask based stencil printing process works well, the resulting bumps still tend to have the standard bump heights described above.

Figure 2A:
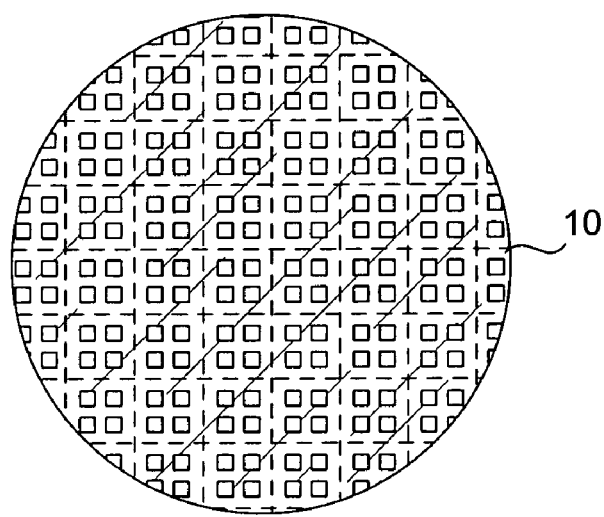
FIG. 2(a) is a diagrammatic top view of a wafer having a solder stencil in accordance with the present invention positioned thereon.
Figure 2B:
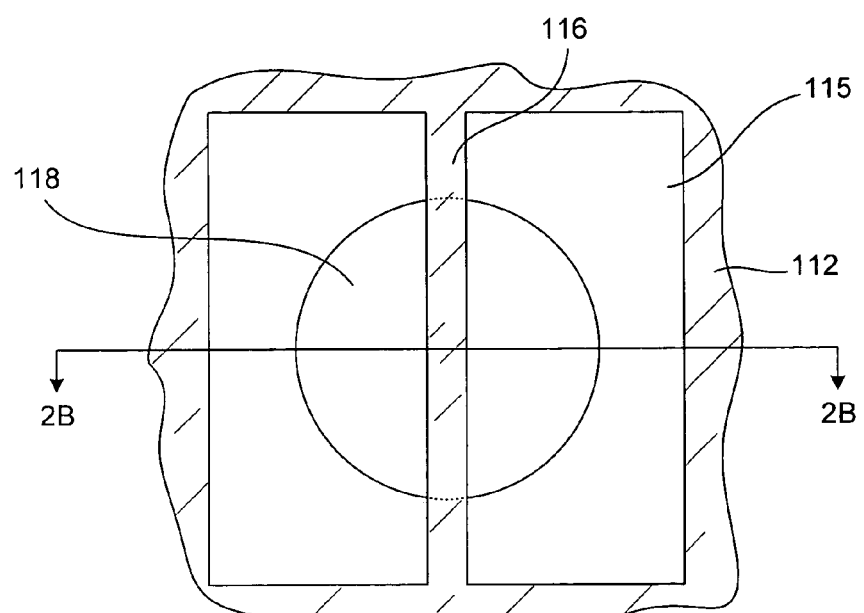
FIG. 2(b) is a diagrammatic top view of the stencil shown in FIG. 2(a) showing a pair of stencil openings formed over a single metallization pad in accordance with one embodiment of the present invention.

Referring next to FIGS. 2(a)-2(d) an improved stencil arrangement and bump fabrication process in accordance with the present invention will be described. In the illustrated embodiment, a laminate polymeric stencil 112 is applied to a wafer 110. However, as best seen in FIG. 2(b) rather than having a single opening formed over each metallization pad, a plurality of openings 115 partially overlay each metallization pad 118 with divider strips 116 extending over the metallization pad between the adjacent openings. The divider strips 116 are an integral part of the stencil 112. The number and geometry of the openings 115 used may vary depending on the needs of a particular application. In the embodiment shown in FIG. 2(b), a pair of substantially rectangular openings 115 are provided. However, in alternative embodiments, three, four or more openings may be provided over a particular metallization pad. The combined volume of the openings is selected to provide the desired solder bump height as will be described in more detail below.

Figure 2C:
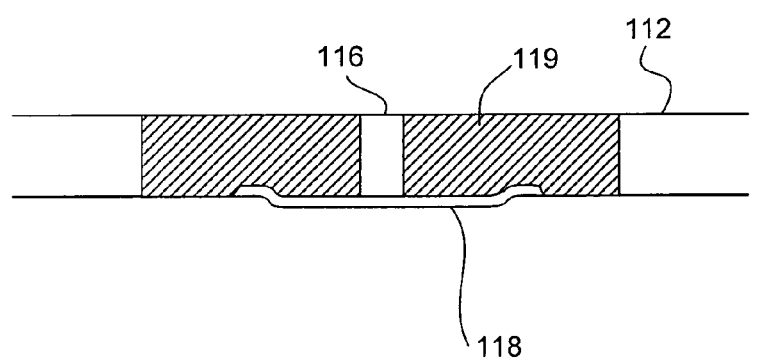
FIG. 2(c) is a diagrammatic side view of the stencil shown in FIG. 2(b) over a single metallization pad with the solder paste in place.

After the mask 112 has been positioned, solder is stencil printed onto the mask in order to fill the openings 115 with solder paste 119 as best seen in FIG. 2(c). Conventional stencil printing techniques can be used to apply the solder paste. It is noted that when stencil gaps of greater than about 330 microns are used with a 4 mil stencil thickness, it can be difficult to prevent the squeegee used in the stencil printing operation from "scooping" some of desired solder paste out of the opening. An additional benefit of using the elongated openings of FIG. 2(b) is that the alignment of the openings can be coordinated with the direction that the squeegee (which is illustrated by arrow 127 of FIG. 2(b)) to reduce or eliminate such scooping.

Figure 2D:
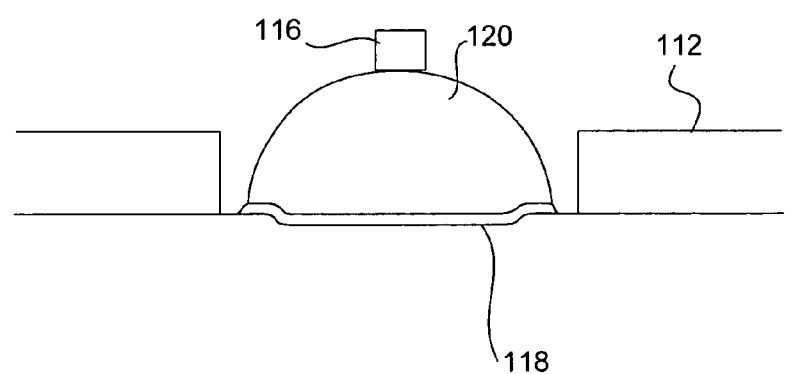
FIG. 2(d) is a diagrammatic side view of the arrangement shown in FIG. 2(c) after the solder has been reflowed.

After the solder paste 119 has been applied, it may be reflowed with the mask 112 left in place. When the solder is reflowed, the solder adheres very well to the metallization pad 118 and creeps underneath the divider strips 116. The creep is sufficient so that reflowed solder from adjacent openings that overlie the same metallization pad will join. When the solder joins, the surface tension of the molten solder is sufficient to lift the divider strip 116 out of the way as best seen in FIG. 2(d). After the solder bumps 120 cool and solidify, the mask may be removed and any additional desired wafer level processing, testing or packaging may be performed. When all wafer level processing is completed, the wafer may be diced using any suitable technique. By way of example, wafer sawing and laser cutting work well.

In most cases, the divider strip is compliant enough that it will not significantly deform the resulting solder bumps 120. If deformation of the solder bumps occurs in a particular application, then the solder may be reflown a second time after the stencil 112 is removed so that uniform looking bumps are formed.

As described in the background section of this application, typical bump heights for a solder bump formed on a 280 micron diameter metallization pad may be on the order of 240 microns. Although the height and size of the bumps will vary somewhat based on a number of factors including the amount of solder paste used, as will be appreciated by those familiar with solder bump formation, such a bump will typically have a somewhat spherical appearance and may have a maximum diameter on the order of 320 microns. This results in an aspect ratio (i.e., the ratio of the bump height to maximum bump diameter) on the order of approximately 0.75 and a footprint aspect ratio (i.e., the ratio of the bump height to metallization pad diameter) on the order of approximately 0.86. More generally, aspect ratios in the range of 0.7 to 0.8 are common in conventional wafer level solder bumping applications. The footprint aspect ratios tend to be even higher.

An advantage of the present invention is that it may be used to form low profile solder joints. For example, by choosing the proper amount of solder paste, a somewhat hemispherical appearing bump having a solder bump height in the range of about 125-130 microns may be formed on a 280 micron diameter metallization pad. By way of example, a 4 mil thick stencil having a pair of openings 115 (as illustrated in FIG. 2(b)) that are each approximately 200× 440 microns with a 40 micron wide divider strip 116 works well to form such a bump. It should be appreciated that the proper amount of solder paste (and thus the size of the desired openings) will depend in some part on the nature of the solder paste used, since many pastes have volatile components that will evaporate or liquefy and flow away during the solder reflow process. Additionally, the size of the openings can be adjusted to form solder bumps of virtually any desired size.

The width of the divider strips 116 may vary with the needs of a particular application. However the size of the divider strips will in part be dictated by the material properties of the materials (e.g., laminate polymeric films) used to create the stencil.

It should be appreciated that the aspect ratio for the described bump is significantly lower than the conventional solder bump aspect ratios described above. The described approach can readily be used to form bumps having footprint aspect ratios in the range of approximately 0.35 to 0.65 with good repeatability. By way of example, the aspect ratio and the footprint aspect ratio in the illustrated embodiment are both less than approximately 0.47. Solder bumps having footprint aspect ratios of less than approximately 0.5 are particularly noteworthy. Although the illustrated embodiment involves the use of a bump formed on a 280-micron diameter metallization pad, it should be appreciated that the described technique can be used to form low profile bumps on die metallization pads of virtually any size.

In the illustrated embodiment, the bumps formed are somewhat hemispherical in shape. This will be the case when the footprint aspect ratio is in the neighborhood of about 0.35 to 0.55. As higher bumps are formed, a slightly larger sphere segment will be approximated. The bump height that is attained in a particular application may be controlled in large part by the thickness of the laminate stencil 112 in combination with the size of the openings 115.

Although the formation of the solder bumps has been described primarily in the context of forming solder bumps directly on a die (wafer), it should be appreciated that the described technique can be used to form low profile solder bumps on pads formed on substrates other than a die. For example, the described bumps may be formed on I/O pads on a substrate used in a BGA (ball grid array), PGA (pin grid array) or chip scale package. As will be appreciated by those familiar with the art, such substrates might include BT (bismaleimide-triazine), FR4, FR5 and others.

Figure 3:
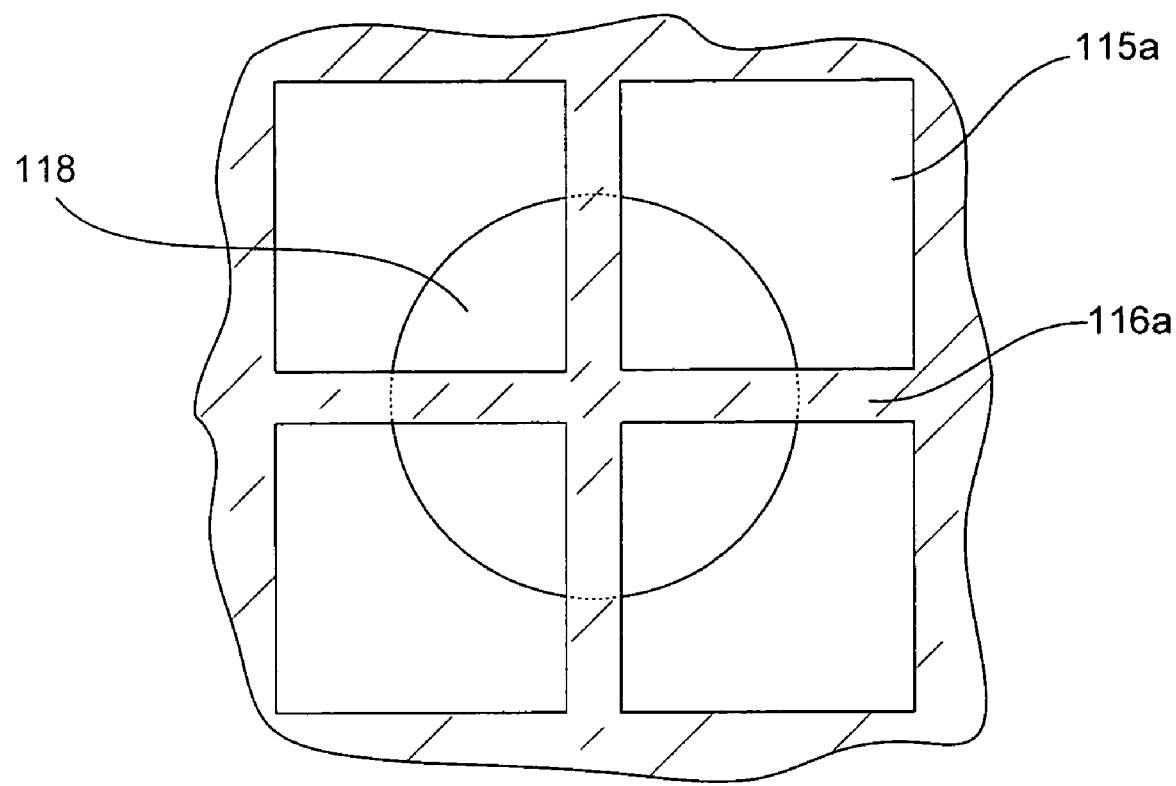
FIG. 3 is a diagrammatic top view of a stencil having four opening formed over a single metallization pad in accordance with a second embodiment of the present invention.

Referring next to FIG. 3, another embodiment of the invention will be described. This embodiment is very similar to the embodiment illustrated in FIGS. 2(a)-2(d) except that in this embodiment an arrangement of four substantially square openings 115(a) are provided in the stencil 112(a) over each metallization pad 118(a). In this embodiment, a pair of divider strips 116(a) orthogonally intersect to form a cross that separate the four openings 115(a). Of course, the number of openings provided over each metallization pad may be widely varied in accordance with the needs of a particular application. In various embodiments 6 or more openings may be used or odd numbers of openings may be used. The geometry of the illustrated openings is substantially rectangular. Although rectangular openings usually have advantages in terms of space utilization, other geometries may readily be used as well.

The described bumps have a number of advantages and are particularly useful in applications where low profile packages are desired. For example, the described somewhat hemispherical bumps may have a much larger footprint for a given bump height than a conventional solder bump. As such, they will produce stronger joints when the devices are eventually soldered to a substrate (such as a printed circuit board (PCB)) than a conventional bump having the same height. As mentioned above, a typical conventional bump on a 150 micron diameter metallization pad may have a bump height on the order of 125-130 microns, a maximum diameter on the order of 170 microns and a bond strength on the order of only about 76 grams per joint. In accordance with the present invention, a bump having a similar height may be formed on a 280-micron metallization pad. Such a bump may have a bond strength more on the order of 250 grams, which may be desirable in a variety of applications, and particularly in applications where there is a need for low profile joints having stronger bond strengths than are attainable using conventional bumps.

Figure 4:
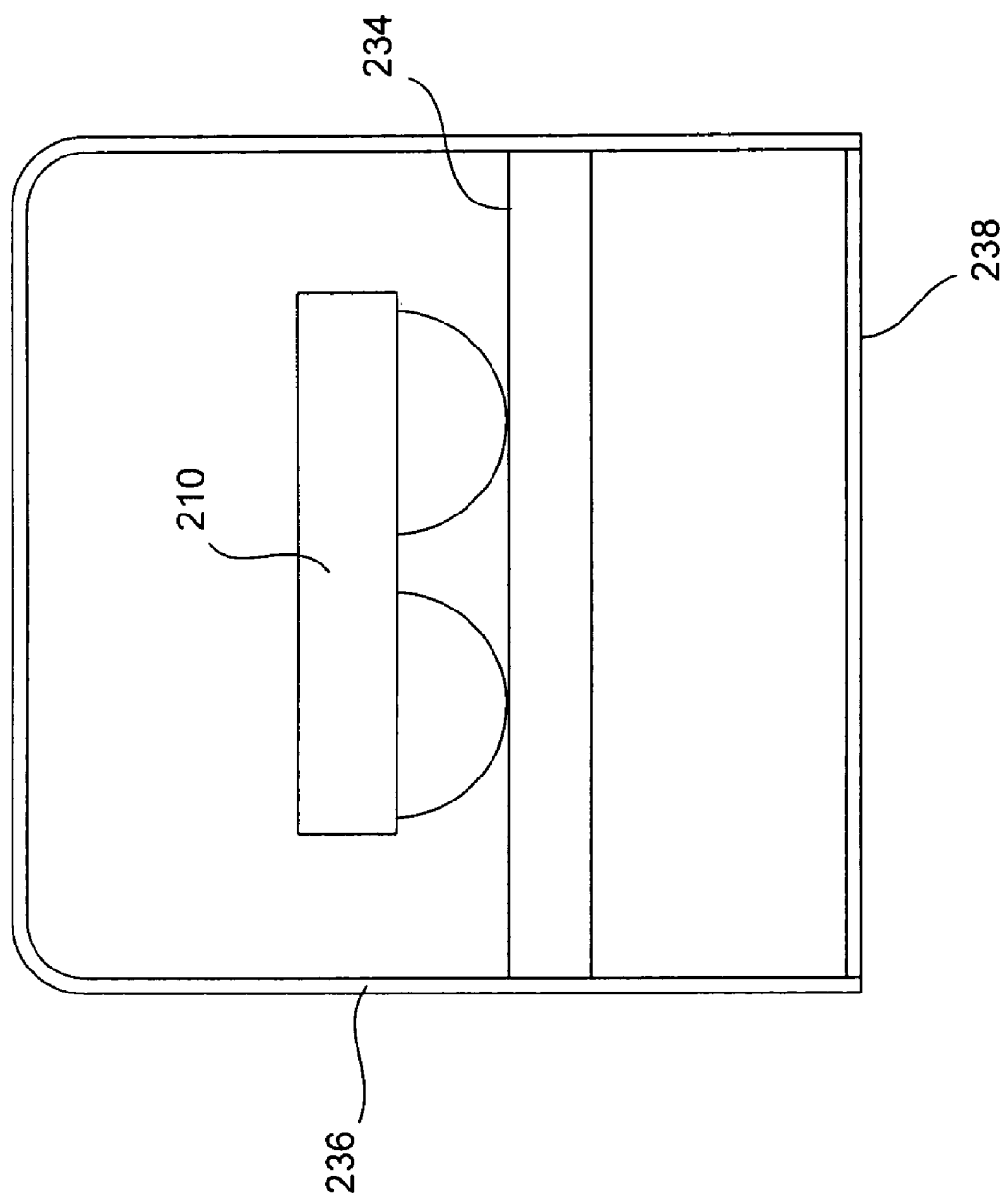
FIG. 4 is a diagrammatic cross sectional view of a microphone incorporating a device formed in accordance with the present invention.

One specific application where the described solder joints are particularly useful is on dice used in very small microphones (as for example may be used in cell phones or other portable electronic or computing devices) as illustrated in FIG. 4. In such applications a die 210 may be mounted on an extremely thin printed circuit board 234 and the arrangement placed in a very small closed end canister 236. A diaphragm 238 is mounted at the open end of the canister. The entire canister is preferably very low profile, as for example 1 mm thick. Therefore, it is important to form low profile solder bumps. For example, solder bumps having a bump height of over 200 microns are not well suited for use in such applications because the height of the resulting solder joints alone may take a significant percentage of the available canister height. At the same time, the microphones tend to be used in applications where there is potentially a fair amount of physical abuse and it is desirable to provide stronger joints than might be available using standard solder bumps on a 150 micron metallization pad. In such applications, there is sufficient room on the die for the larger sized bond pads. Accordingly, this is a good example of an application where bumps formed in accordance with the present invention work particularly well.

The enlarged metallization pads also provide some additional benefits in this type of application as well. Specifically, in the microphone application, the printed circuit board is very thin and is thus somewhat translucent. The die is flip chip mounted on the printed circuit board with the active surface of the die facing the canister opening. Therefore, in practice light tends to penetrate the die. The dice also have analog circuits that are susceptible to light-caused performance shifts. The metallization pads block light penetration into the regions immediately below the metallization pads. Therefore, light sensitive circuits can be formed in regions beneath the metallization pads. The enlarged metallization pads give circuit designers additional room to form the light sensitive circuits without requiring the use of other more expensive light blocking strategies. By way of example, conventional sized bond pads on very small and thin die may occupy on the order of 9 to 20 percent of the surface area of the active surface of the die. In contrast, the enlarged metallization described herein may be used to cover 25%-65% or more of the die's active surface. Thus, coverage of greater than 40 or 50 percent is readily attainable.

Figure 5:
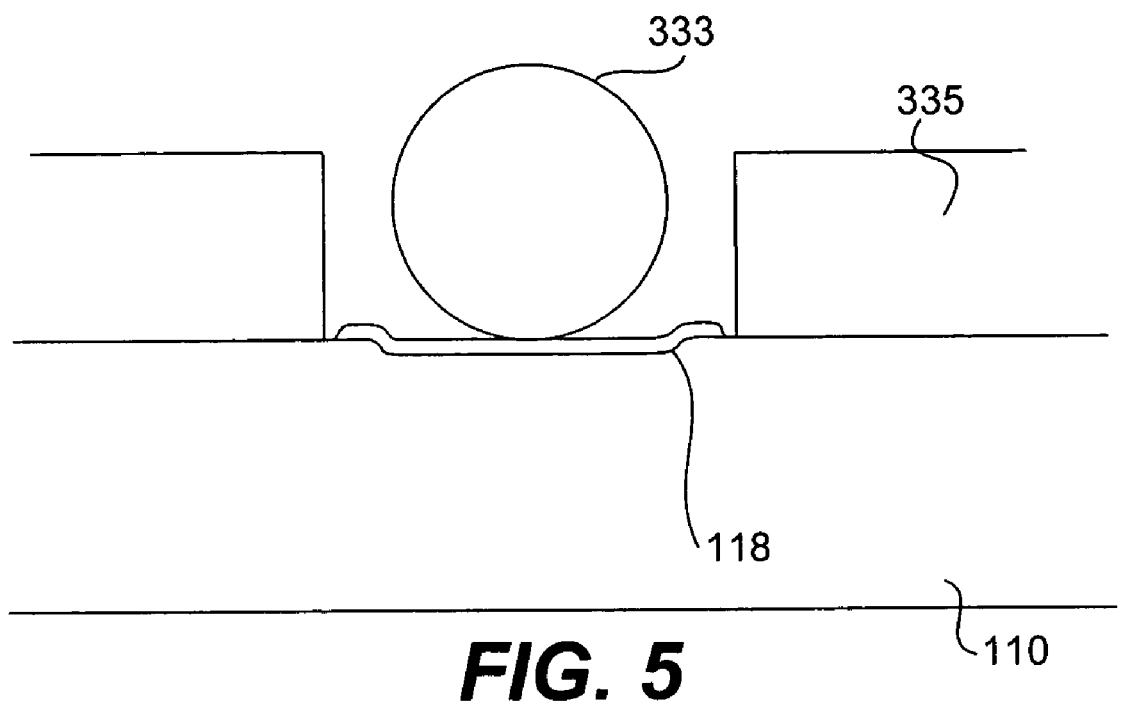
FIG. 5 is a diagrammatic side view of another arrangement for forming low profile solder bumps.

Referring next to FIG. 5, another method of forming the low profile solder bumps will be described. In this embodiment, small preformed solder spheres 333 are placed in a stencil 335 over metallization pads 118. The stencil has openings over each metallization pad 118. The solder balls are then reflowed in a conventional reflow operation to form solder bumps 120. The volume of the spheres is selected so that each sphere contains the amount of solder required to form a solder bump 120 of the desired size. By way of example, a 220 micron diameter ball would work well to form a 130 micron high solder bump on a 280 micron diameter metallization pad.

In still other embodiments, the solder may be plated onto the metallization pads 118.

Although only a few embodiments of the invention have been described in detail, it should be appreciated that the invention may be implemented in many other forms without departing from the spirit or scope of the invention. Although specific embodiments and applications for the described low profile bumps have been given, it should be appreciated that the described bumps may be used in a wide variety of different applications. The size of the metallization pads upon which the low profile bumps are formed (and therefore the footprint diameter of the bumps) may also be widely varied. Additionally, the height of the bumps formed on any particularly sized metallization pad may be varied to meet the needs of a particular application.

Additionally, a novel method for forming solder bumps on semiconductor wafers has been described. The described method can be used to form the improved solder bumps that have been described, or it may be used to form more traditionally sized solder bumps. Similarly, in some situations, other methods may be used to form the described new solder bumps. Therefore, the present embodiments are to be considered as illustrative and not restrictive and the invention is not to be limited to the details given herein, but may be modified within the scope and equivalents of the appended claims.

What is claimed is:

1. A semiconductor device comprising:
   an integrated circuit die having a multiplicity of under bump metallization pads formed on an active surface of the die; and
   a plurality of solder bumps, each solder bump being formed on an associated under bump metallization pad, each solder bump having a height, a footprint diameter and a footprint aspect ratio defined as the ratio of the solder bump height to the footprint diameter that is between approximately 0.35 and 0.4.

2. An arrangement comprising:
   a semiconductor wafer having a multiplicity of dice formed thereon, each die having a plurality of metallization pads on an active surface of the wafer;
   a polymer stencil applied to the active surface of the wafer, wherein the stencil has openings that at least partially overlay associated metallization pads and divider strips positioned between at least some adjacent openings, wherein the divider strips are arranged to overlay portions of associated metallization pads such that at least two adjacent openings overlay portions of the each metallization pad having an associated divider strip; and
   a solder material located in the stencil openings.

3. A semiconductor device as recited in claim 2 wherein the solder material is reflowed to form solder bumps that have a height that is less than approximately 150 microns and a footprint diameter that is greater than approximately 250 microns.

4. A semiconductor device as recited in claim 3 wherein the height of the solder bumps is no more than approximately 130 microns and the footprint diameter of the solder bumps is at least approximately 280 microns.

5. A semiconductor device as recited in claim 2 wherein the plurality of metallization pads are substantially circular.

6. A semiconductor device as recited in claim 2 wherein the plurality of metallization pads occupy at least approximately 40 percent of the area of the active surface of the die.

7. An arrangement as recited in claim 2 wherein the solder is a solder paste and the solder paste substantially fills the openings.

8. A arrangement as recited in claim 2 wherein at least some of the metallization pads have at least two associated divider strips so that at least four openings overlay portions of such metallization pads.

9. An arrangement as recited in claim 2 wherein the polymer stencil is intended to be removed after the solder material is reflowed.

10. An arrangement comprising:
    a semiconductor wafer having a multiplicity of dice formed thereon, each die having a plurality of metallization pads on an active surface of the wafer;
    a polymer stencil applied to the active surface of the wafer, wherein the stencil has openings that at least partially overlay associated metallization pads and divider strips positioned between at least some adjacent openings, wherein the divider strips are arranged to overlay portions of associated metallization pads such that at least two adjacent openings overlay portions of the each metallization pad having an associated divider strip; and
    a solder material located in the stencil openings,
    wherein the solder is in the form of solder bumps that have been reflowed from a solder paste, wherein the solder bumps have lifted the divider strips off of their associated metallization pads.

11. A arrangement comprising:
    a semiconductor wafer having a multiplicity of dice formed thereon, each die having a plurality of metallization pads on an active surface of the wafer;
    a polymer stencil applied to the active surface of the wafer, wherein the stencil has openings that at least partially overlay associated metallization pads and divider strips positioned between at least some adjacent openings, wherein the divider strips are arranged to overlay portions of associated metallization pads such that at least two adjacent openings overlay portions of the each metallization pad having an associated divider strip; and
    a solder material located in the stencil openings,
    wherein the openings are arranged to extend over a portion of a passivation layer adjacent their associated metallization pad, whereby the height of reflowed solder balls can be controlled by controlling the volume of the openings associated with each metallization pad.

12. A packaged semiconductor device comprising:
    a substrate having a multiplicity of contact pads;
    an integrated circuit die mounted on and electrically connected to the substrate; and
    a plurality of solder bumps, each solder bump being formed on an associated contact pad, each solder bump having a height, a footprint diameter and a footprint aspect ratio defined as the ratio of the solder bump height to the footprint diameter that is between approximately 0.35 and 0.4.

13. A semiconductor device comprising:
    an integrated circuit die having a multiplicity of under bump metallization pads formed on an active surface of the die; and
    a plurality of solder bumps, each solder bump being formed on an associated under bump metallization pad, each solder bump having a height, a footprint diameter and a footprint aspect ratio defined as the ratio of the solder bump height to the footprint diameter that is between approximately 0.35 and 0.4,
    wherein the height is no more than approximately 130 microns and the footprint diameter is at least approximately 280 microns,
    wherein the under bump metallization pads occupy at least approximately 40 percent of the area of the active surface of the die, and
    wherein each solder bump is approximately hemispherical with a base of the hemisphere facing the associated under bump metallization pad.

* * * * *